(12) United States Patent
Arai

(10) Patent No.: US 7,847,477 B2
(45) Date of Patent: Dec. 7, 2010

(54) METHOD OF MANUFACTURING DISPLAY UNIT AND DISPLAY UNIT

(75) Inventor: Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 12 days.

(21) Appl. No.: 12/480,363

(22) Filed: Jun. 8, 2009

(65) Prior Publication Data
US 2009/0302757 A1    Dec. 10, 2009

(30) Foreign Application Priority Data
Jun. 9, 2008    (JP) .............................. 2008-150567

(51) Int. Cl.
*H01J 9/00* (2006.01)
*H01J 1/62* (2006.01)
(52) U.S. Cl. .................. 313/505; 445/49; 313/498; 313/512
(58) Field of Classification Search ............. 445/23–25, 445/49–51; 313/498–512, 309, 336, 351
See application file for complete search history.

(56) References Cited
FOREIGN PATENT DOCUMENTS

| JP | 2003-115393 | 4/2003 |
|---|---|---|
| JP | 2005-011792 | 1/2005 |
| JP | 2005-268099 | 9/2005 |
| JP | 2005-276689 | 10/2005 |
| JP | 2007-141602 | 6/2007 |

OTHER PUBLICATIONS

Japanese Patent Office Action corresponding to Japanese Serial No. 2008-150567 dated Apr. 20, 2010.

*Primary Examiner*—Joseph L Williams
(74) *Attorney, Agent, or Firm*—SNR Denton US LLP

(57) ABSTRACT

A method of manufacturing a display unit and a display unit capable of decreasing particles caused by a sputtering target of an oxide electric conductor and obtaining favorable electric conductive characteristics between a metal and the oxide electric conductor in the case where a first electrode has a laminated structure including the metal and the oxide electric conductor are provided. The method of manufacturing a display unit having a display layer between a first electrode and a second electrode, wherein a step of forming the first electrode includes the steps of: forming a laminated structure sequentially including a first layer made of a metal and a second layer made of a metal whose oxide exhibits electric conductivity over a substrate; and providing surface oxidation treatment after forming the laminated structure and thereby forming an oxide electric conductor film in at least part in a thickness direction of the second layer.

9 Claims, 13 Drawing Sheets

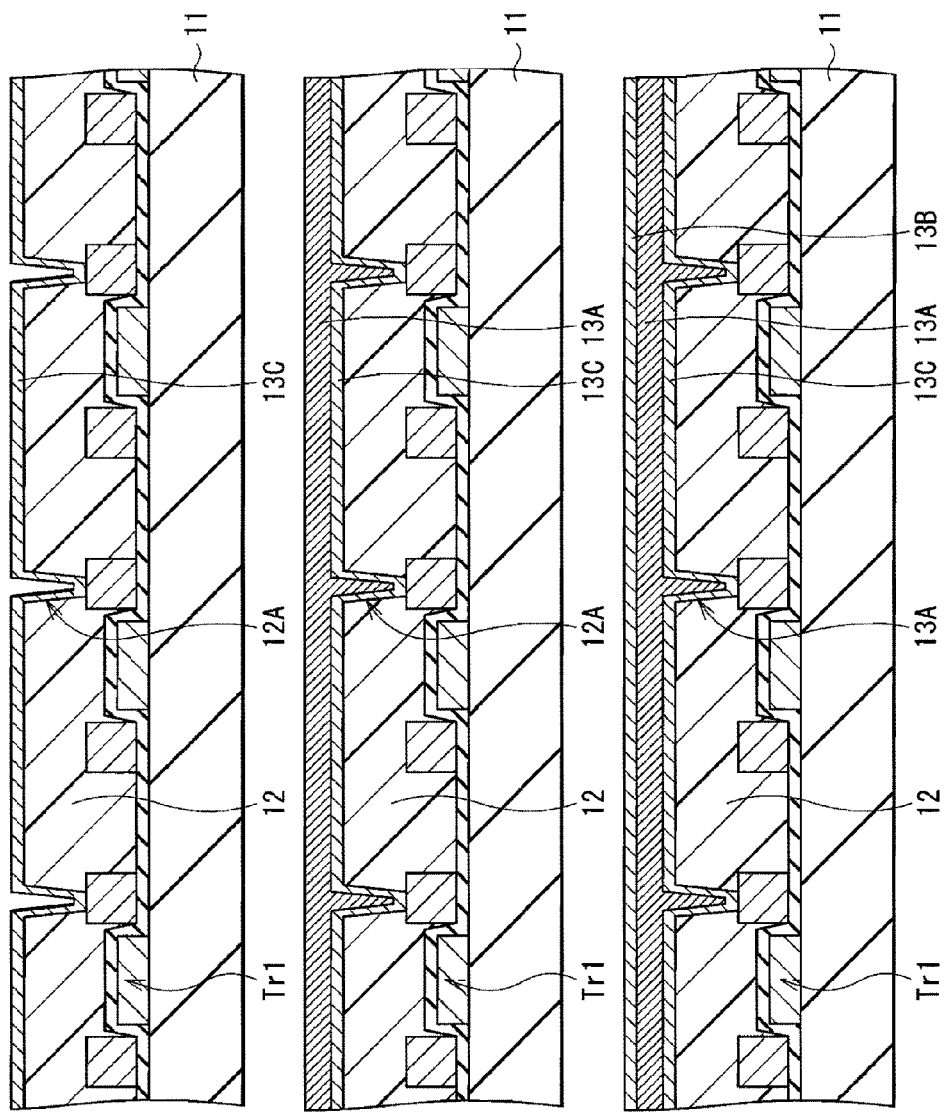

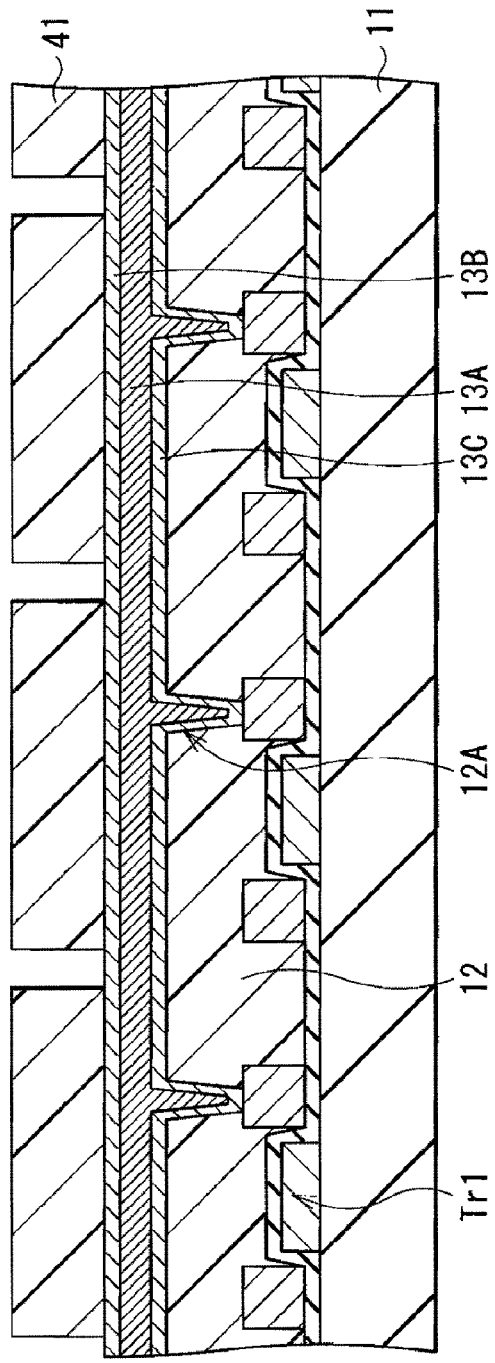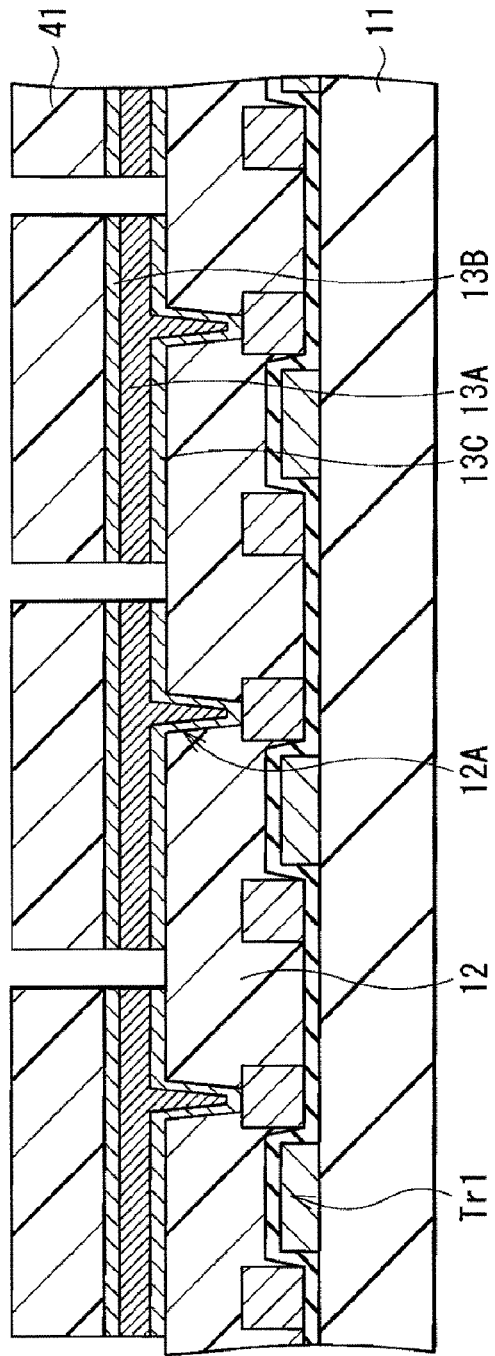

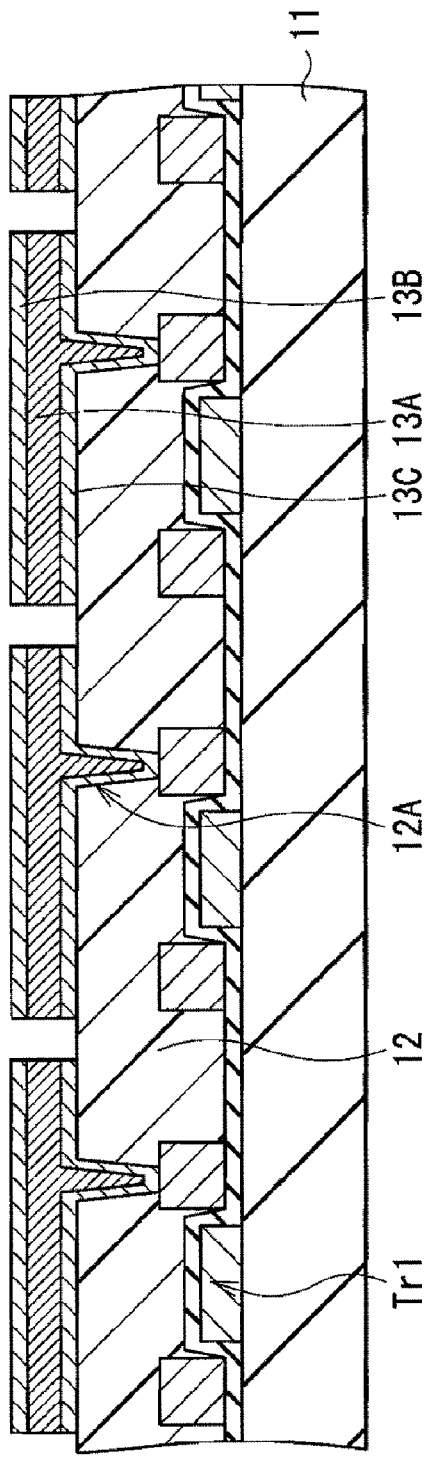
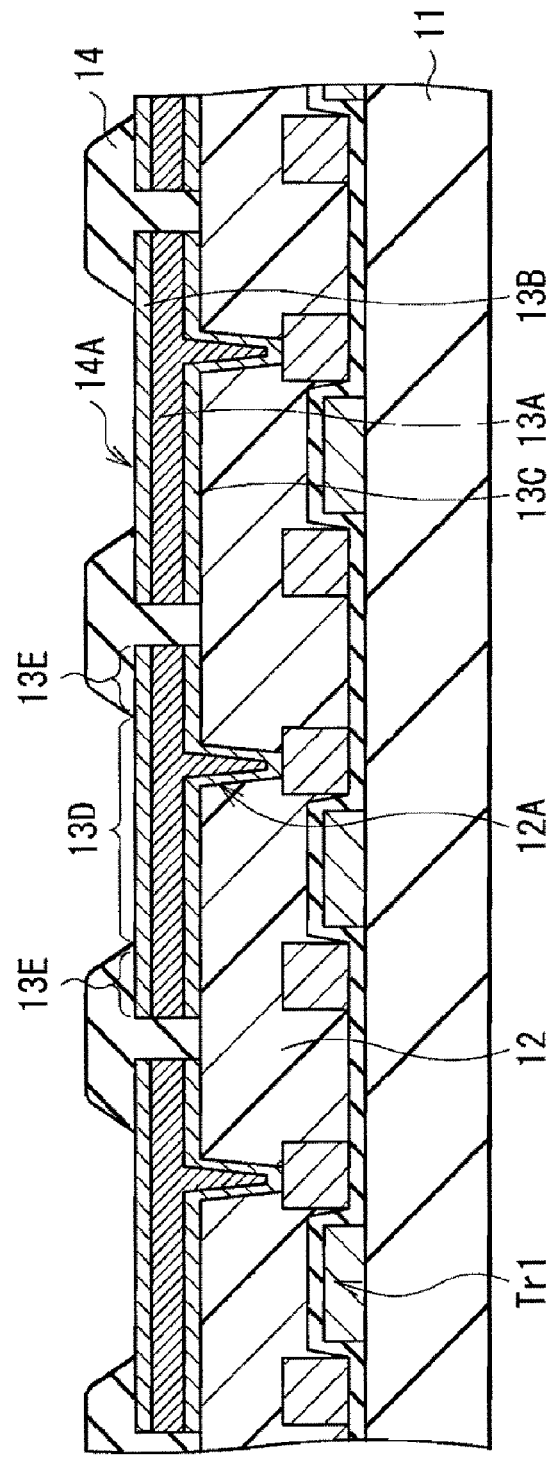
FIG. 7A
FIG. 7B

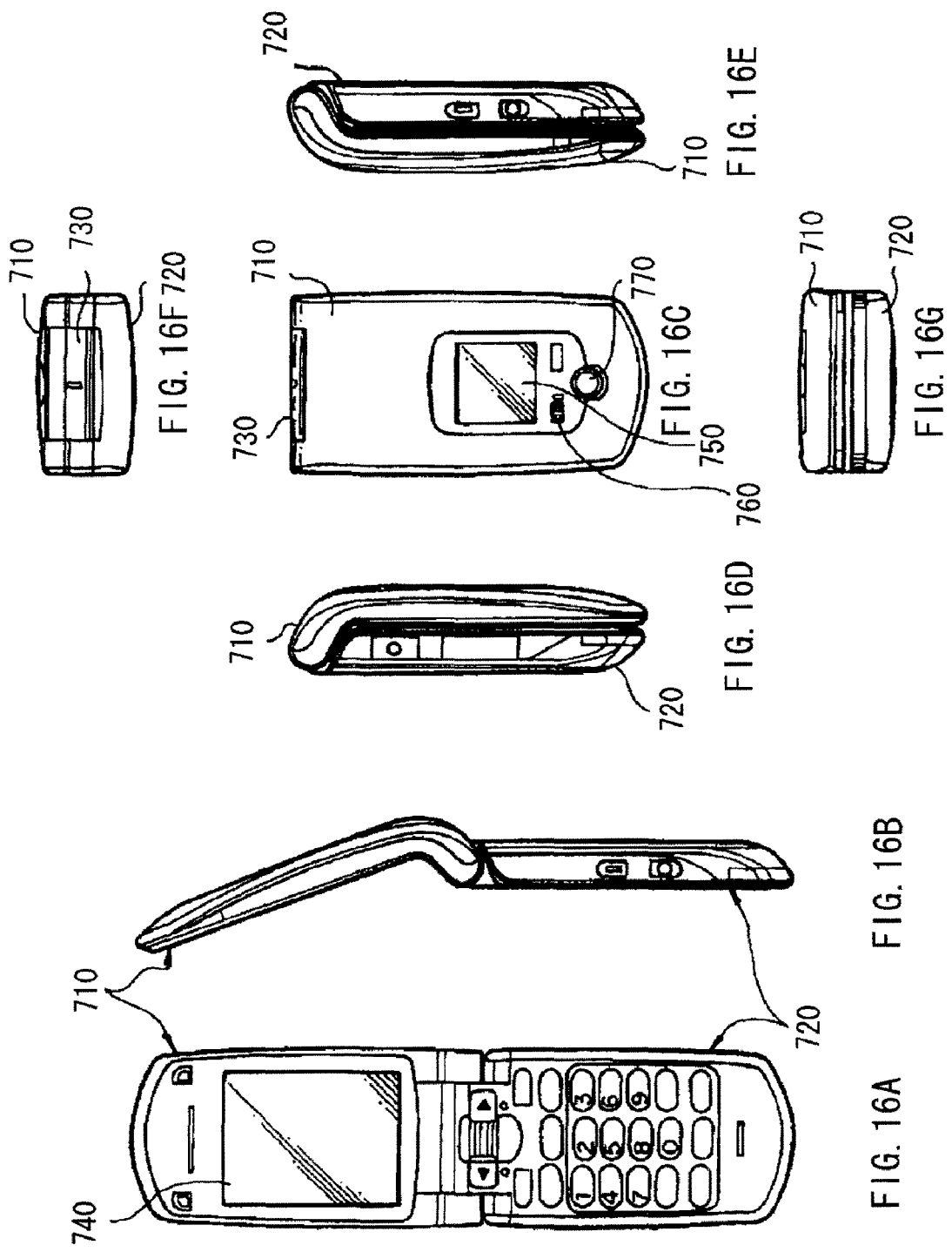

METHOD OF MANUFACTURING DISPLAY UNIT AND DISPLAY UNIT

BACKGROUND OF THE INVENTION

1. Field of the Invention

The present invention relates to a method of manufacturing a display unit using an organic light emitting device or liquid crystal and a display unit.

2. Description of the Related Art

In recent years, in the field of display units, next-generation displays have been actively developed, and space saving, high luminance, low power consumption and the like have been requested. As such a display unit, an organic EL (Electro Luminescence) display unit using an organic light emitting device has attracted attention. The organic EL display unit has characteristics as follows. That is, since the organic EL display unit is self-light emitting type, the view angle is wide. Since the organic EL display unit does not need a backlight, electric power saving is able to be expected, its response is high, and the thickness of the unit itself is able to be decreased. Further, since a plastic substrate is used as a substrate of the organic EL display unit in order to use the inherent flexibility of an organic light emitting material, the organic EL display unit attracts attention as a unit having flexibility.

Of the drive systems in the organic EL display unit, active matrix system in which a thin film transistor (TFT) as a drive element is used has more superior response and superior resolution to those of passive matrix system. Thus, the active matrix system is regarded as a drive system particularly suitable for the organic EL display unit having the foregoing advantages.

The active matrix organic EL display unit has a drive panel provided with an organic light emitting device (organic EL device) including a light emitting layer made of an organic light emitting material between a first electrode and a second electrode, and the drive element (thin film transistor) for driving the organic light emitting device. The drive panel and a sealing panel are bonded with an adhesive layer in between so that the organic light emitting device is sandwiched therebetween.

In the organic EL display unit, there are bottom emission type in which light from each organic light emitting device is emitted to the foregoing drive panel side and top emission type in which such light is emitted to the foregoing sealing panel side on the contrary. The latter type is able to increase the aperture ratio more, and the latter type is the developmental mainstream.

In the top emission type organic EL display unit, for the first electrode on the lower layer side, that is, on the drive element side, a material having relatively large work function with which hole is easily injected into the light emitting layer, for example, an oxide conductive material such as ITO (Indium Tin Oxide) is used. However, the oxide conductive material has resistivity higher by double or triple digit than that of a general wiring metal material or the like, and thus the oxide conductive material has not been able to be utilized to a material of wirings and the like other than the first electrode. Further, there has been a disadvantage that light emitted in a downward direction may not be effectively used.

Therefore, for example, Japanese Unexamined Patent Application Publication No. 2003-115393 discloses that a metal film having high reflectance and low resistivity is formed as a layer located lower than a transparent conducting film such as ITO, and thereby being utilized to wirings and the like.

SUMMARY OF THE INVENTION

In the configuration of Japanese Unexamined Patent Application Publication No. 2003-115393, the transparent conducting film is formed by sputtering or the like. However, a sputtering target of an oxide electric conductor such as ITO is more rigid and more fragile than a metal target. Thus, to perform film forming onto a large glass substrate with over 1 m on a side, the target should be divided into several portions. As a result, particles are easily adhered to a location corresponding to a divided part. The particles penetrate an organic layer to be subsequently formed, which causes interlayer short circuit defect between a second electrode and a first electrode, resulting in generation of defect of light emission (dark dot pixel defect).

Further, as the metal film, for example, silver, aluminum, or an alloy thereof has been used. However, such a material is easily subject to generation of a surface oxide film. Thus, there is a possibility that contact resistance between the metal film and the transparent conducting film is increased, and light emission performance is lowered.

In view of the foregoing disadvantages, in the invention, it is desirable to provide a method of manufacturing a display unit and a display unit capable of decreasing particles caused by a sputtering target of an oxide electric conductor and obtaining favorable electric conductive characteristics between a metal and an oxide electric conductor in the case where a first electrode has a laminated structure including the metal and the oxide electric conductor.

According to an embodiment of the invention, there is provided a method of manufacturing a display unit having a display layer between a first electrode and a second electrode, in which a step of forming the first electrode includes the following steps A and B:

A. step of forming a laminated structure sequentially including a first layer made of a metal and a second layer made of a metal whose oxide exhibits electric conductivity over a substrate; and B. step of providing surface oxidation treatment after forming the laminated structure and thereby forming an oxide electric conductor film in at least part in a thickness direction of the second layer.

According to an embodiment of the invention, there is provided a first display unit having a display layer between a first electrode and a second electrode. The first electrode is formed by forming a laminated structure sequentially including a first layer made of a metal and a second layer made of a metal whose oxide exhibits electric conductivity over a substrate, and then providing surface oxidation treatment and thereby forming an oxide electric conductor film in at least part in the thickness direction of the second layer.

According to an embodiment of the invention, there is provided a second display unit having a display layer between a first electrode and a second electrode. The first electrode has a laminated structure composed of a first layer made of a metal and a second layer, an insulating film covering part in a planar shape of the second layer is provided on the first electrode, at least part in the thickness direction of a surface exposed portion exposed from the insulating film of the second layer is an oxide electric conductor film, and a surface coated portion covered with the insulating film out of the second layer is a metal film made of a metal whose oxide exhibits electric conductivity.

In the first display unit of the embodiment of the invention, the first electrode is formed by forming the laminated structure sequentially including the first layer made of the metal and the second layer made of the metal whose oxide exhibits electric conductivity over the substrate, and then providing the surface oxidation treatment and thereby forming the oxide electric conductor film in at least part in the thickness direction of the second layer. Thus, particles caused by a sputtering target in forming the second layer are decreased. Accordingly, dark dot defect due to interlayer short circuit defect is suppressed.

In the second display unit of the embodiment of the invention, the first electrode has the laminated structure including the first layer made of the metal and the second layer. At least part in the thickness direction of the surface exposed portion exposed from the insulating film of the second layer is the oxide electric conductor film. Meanwhile, the surface coated portion covered with the insulating film of the second layer is the metal film made of the metal whose oxide exhibits electric conductivity. Thus, even if an oxide film is formed in the surface layer of the first layer, the first layer is connected to the oxide electric conductor film through the metal film with low contact resistance, and favorable electric conductivity is obtainable between the first layer and the second layer.

According to the method of manufacturing a display unit of the embodiment of the invention or the first display unit of the embodiment of the invention, the first electrode is formed by forming the laminated structure sequentially including the first layer made of the metal and the second layer made of the metal whose oxide exhibits electric conductivity over the substrate, and then providing the surface oxidation treatment and thereby forming the oxide electric conductor film in at least part in the thickness direction of the second layer. Thus, particles caused by the sputtering target in forming the second layer are decreased. Accordingly, dark dot defect due to interlayer short circuit defect may be prevented.

According to the second display unit of the embodiment of the invention, the first electrode has the laminated structure including the first layer made of the metal and the second layer. At least part in the thickness direction of the surface exposed portion exposed from the insulating film of the second layer is the oxide electric conductor film. Meanwhile, the surface coated portion coated with the insulating film of the second layer is the metal film made of the metal whose oxide exhibits electric conductivity. Thus, even if an oxide film is formed in the surface layer of the first layer, the first layer is connected to the oxide electric conductor film through the metal film with low contact resistance, and favorable electric conductivity is obtainable between the first layer and the second layer.

Other and further objects, features and advantages of the invention will appear more fully from the following description.

BRIEF DESCRIPTION OF THE DRAWINGS

FIGS. 5A to 5C are cross sectional views illustrating a method of manufacturing the display unit illustrated in FIG. 1 to FIG. 4 in order of steps;

FIGS. 6A and 6B are cross sectional views illustrating steps following FIGS. 5A to 5C;

FIGS. 7A and 7B are cross sectional views illustrating steps following FIGS. 6A and 6B;

FIG. 16A is an elevation view of a fifth application example unclosed, FIG. 16B is a side view thereof, FIG. 16C is an elevation view of the fifth application example closed, FIG. 16D is a left side view thereof, FIG. 16E is a right side view thereof, FIG. 16F is a top view thereof, and FIG. 16G is a bottom view thereof.

DETAILED DESCRIPTION OF THE PREFERRED EMBODIMENT

An embodiment of the invention will be hereinafter described in detail with reference to the drawings.

Figure 1:
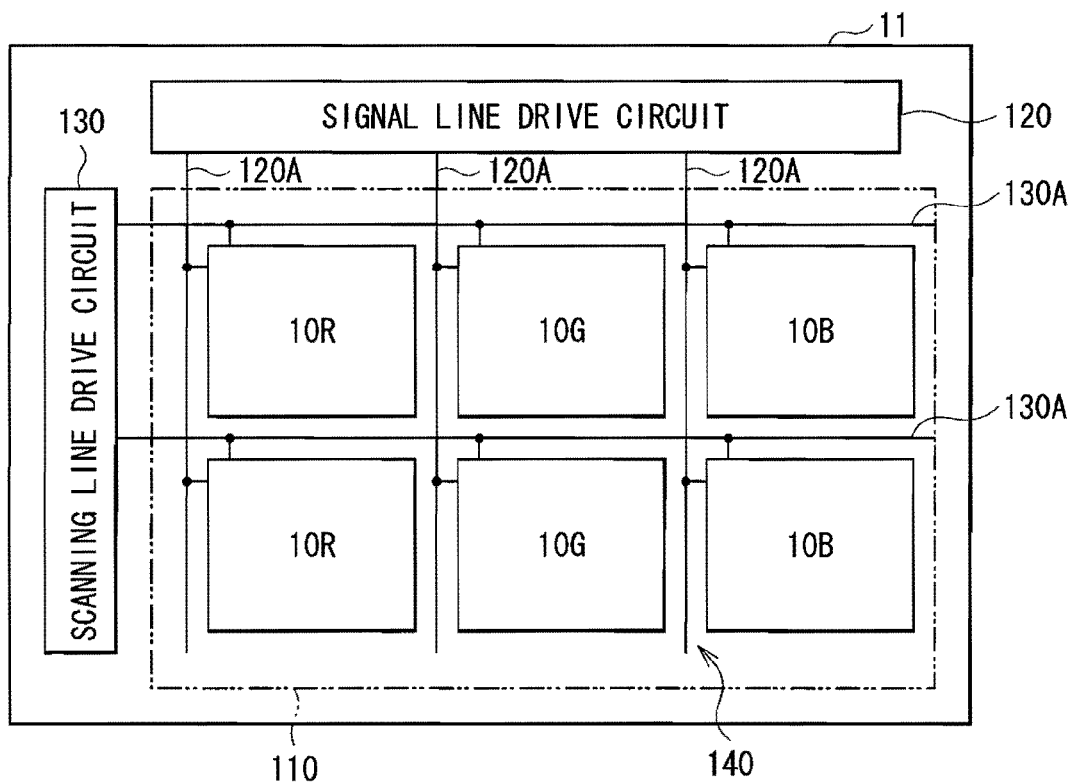
FIG. 1 is a diagram illustrating a configuration of a display unit according to an embodiment of the invention.

FIG. 1 illustrates a configuration of a display unit according to an embodiment of the invention. The display unit is used as an ultrathin organic light emitting color display unit or the like. In the display unit, for example, a display region 110 in which a plurality of organic light emitting devices 10R, 10G and 10B described later are arranged in a matrix state is formed over a substrate 11 made of, for example, glass, a silicon (Si) wafer, a resin or the like. A signal line drive circuit 120 and a scanning line drive circuit 130 that are drivers for displaying a picture are formed on the periphery of the display region 110.

Figure 2:
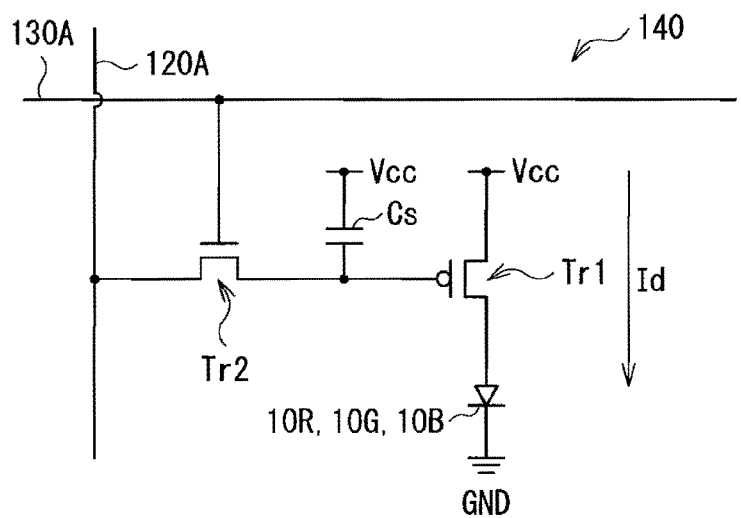
FIG. 2 is an equivalent circuit illustrating an example of the pixel drive circuit illustrated in FIG. 1.

In the display region 110, a pixel drive circuit 140 is formed. FIG. 2 illustrates an example of the pixel drive circuit 140. The pixel drive circuit 140 is formed in a layer located lower than a first electrode 13 described later. The pixel drive circuit 140 is an active drive circuit having a drive transistor Tr1, a writing transistor Tr2, a capacitor (retentive capacity) Cs between the drive transistor Tr1 and the writing transistor Tr2, and the organic light emitting device 10R (or 10G, 10B) serially connected to the drive transistor Tr1 between a first power line (Vcc) and a second power line (GND). The drive transistor Tr1 and the writing transistor Tr2 are composed of a general thin film transistor (TFT (Thin Film Transistor)). The structure thereof is not particularly limited, and may be, for example, inversely staggered structure (so-called bottom gate type) or staggered structure (top gate type).

In the pixel drive circuit 140, a plurality of signal lines 120A are arranged in the column direction, and a plurality of scanning lines 130A are arranged in the row direction. Each cross section between each signal line 120A and each scanning line 130A corresponds to one of the organic light emitting devices 10R, 10G and 10B (sub pixel). Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied to a gate electrode of the writing transistor Tr2 from the scanning line drive circuit 130 through the scanning line 130A.

Figure 3:
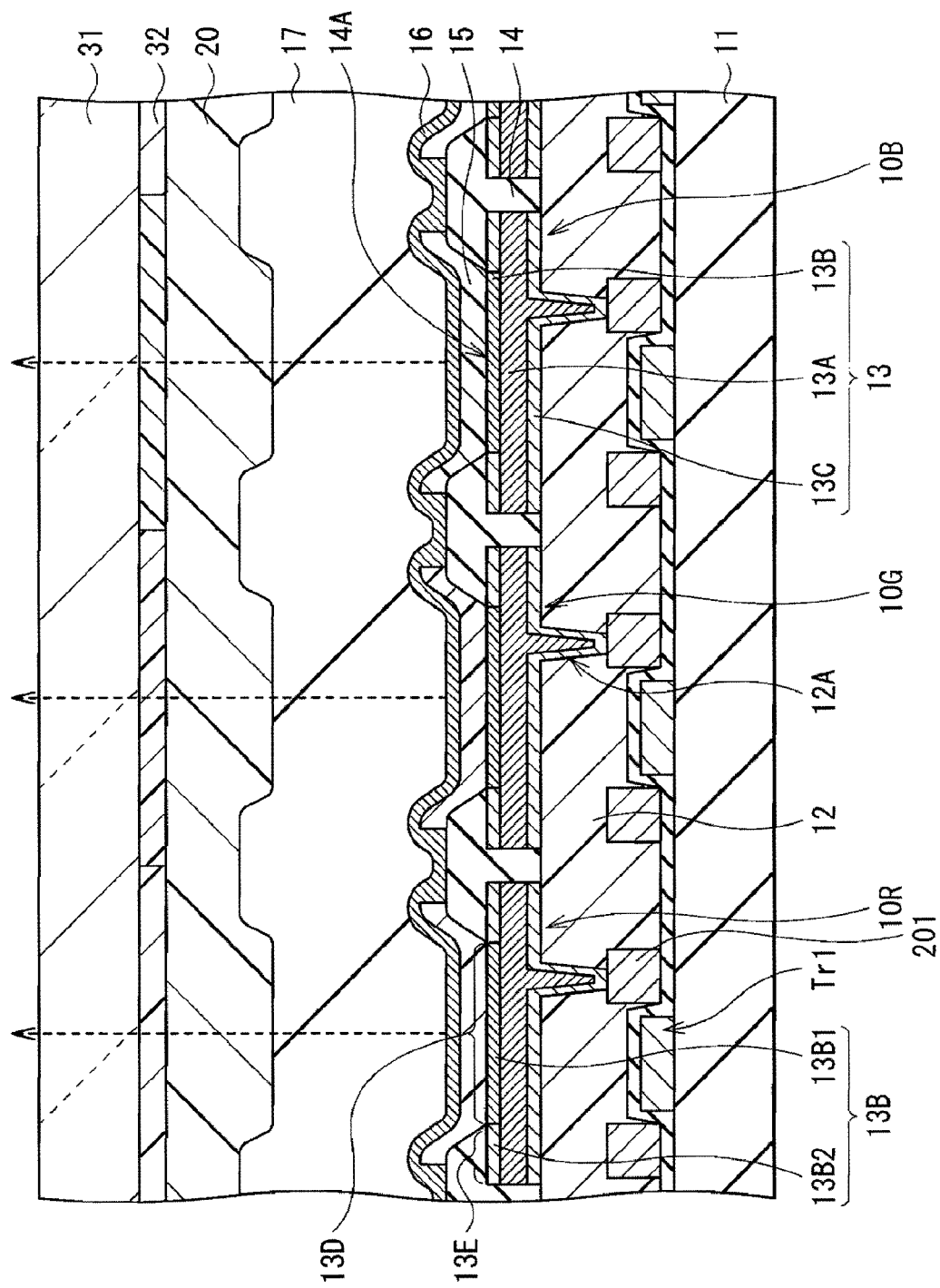
FIG. 3 is a cross sectional view illustrating a configuration of the display region illustrated in FIG. 1.

FIG. 3 illustrates a cross sectional configuration of the display region 110. In the display region 110, the organic light emitting device 10R generating red light, the organic light emitting device 10G generating green light, and the organic light emitting device 10B generating blue light are sequentially formed in a matrix state as a whole. The organic light emitting devices 10R, 10G and 10B have a reed-like planar shape, and a combination of the organic light emitting devices 10R, 10G and 10B adjacent to each other composes one pixel.

In the organic light emitting devices 10R, 10G and 10B, the drive transistor Tr1 of the foregoing pixel drive circuit 140, a planarizing layer 12, the first electrode 13 as an anode, an insulating film 14, an organic layer 15 including a light emitting layer described later, and a second electrode 16 as a cathode are layered in this order from the substrate 11 side.

The organic light emitting devices 10R, 10G and 10B as above are coated with a protective film 17 composed of silicon nitride (SiN), silicon oxide (SiO) or the like according to needs. Further, a sealing substrate 31 made of glass or the like is bonded to the whole area of the protective film 17 with an adhesive layer 20 made of a thermoset resin, an ultraviolet curable resin or the like in between, and thereby the organic light emitting devices 10R, 10G and 10B are sealed. The sealing substrate 31 may be provided with a color filter 32 and a light shield film (not illustrated) as a black matrix according to needs.

The drive transistor Tr1 is electrically connected to the first electrode 13 through a connection hole 12A provided in the planarizing layer 12.

The planarizing layer 12 is intended to planarize a front face of the substrate 11 provided with the pixel drive circuit 140. Since the fine connection hole 12A is formed in the planarizing layer 12, the planarizing layer 12 is preferably made of a material having favorable pattern precision. Examples of materials of the planarizing layer 12 include an organic material such as polyimide, an inorganic material such as silicon oxide ($SiO_2$) and the like.

The first electrode 13 is formed correspondingly to the respective organic light emitting devices 10R, 10G and 10B. The first electrode 13 has, for example, a laminated structure sequentially including a first layer 13A made of a metal and a second layer 13B. The first electrode 13 may have a third layer 13C between the first layer 13A and the planarizing layer 12.

The first layer 13A has a function as a reflecting electrode to reflect light generated in the light emitting layer, and desirably has high reflectance as much as possible in order to improve light emitting efficiency. The first layer 13A is, for example, from 100 nm to 1000 nm both inclusive thick, specifically about 200 nm thick, and is composed of a high reflectance electric conductor, specifically, aluminum (Al) or an alloy containing aluminum (Al), or silver (Ag) or an alloy containing silver (Ag). As the aluminum alloy, for addressing preventive measure for corrosion that might be generated in an etching step, a cleaning step, a resist separation step or the like, an alloy having a standard electrode potential close to that of an indium alloy is preferable. Examples of aluminum alloys include an aluminum-nickel alloy, an aluminum-platinum alloy and the like.

Figure 4:
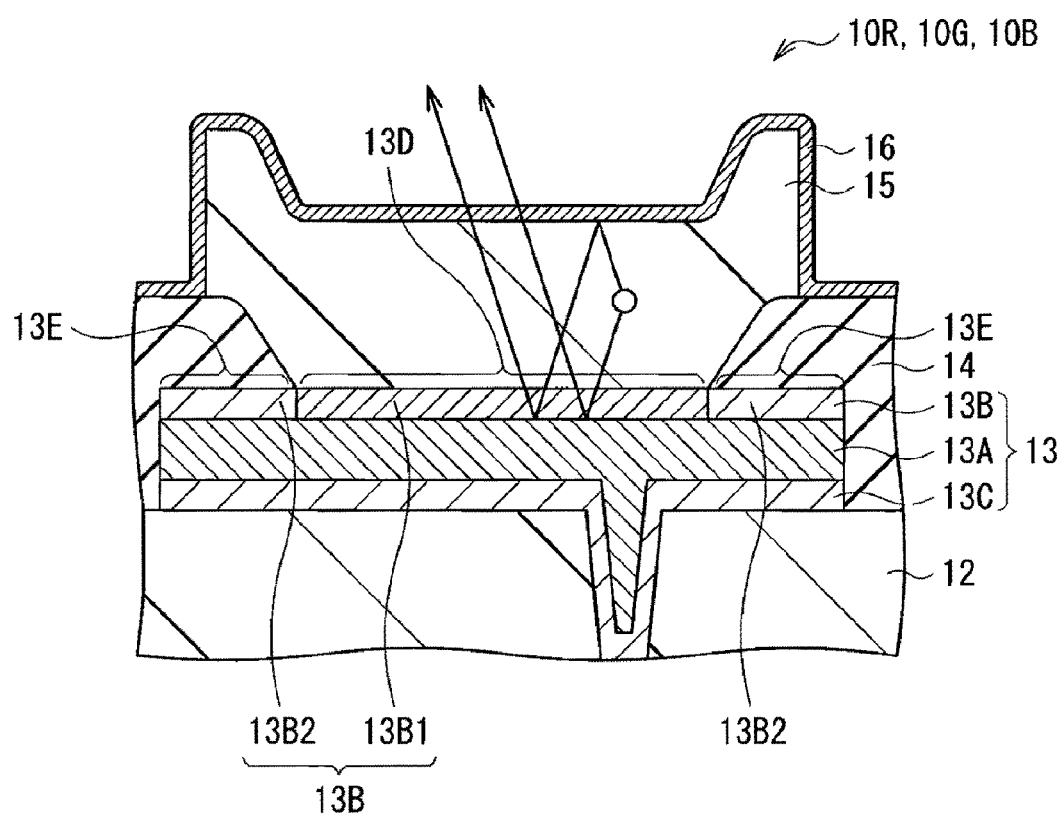
FIG. 4 is a cross sectional view illustrating a structure of the first electrode illustrated in FIG. 3.

The second layer 13B also has a function as a work function adjustment layer to increase efficiency of electron hole injection into the organic layer 15, and is preferably made of a material having a work function higher than that of the first layer 13A. Further, as illustrated in FIG. 4, the insulating film 14 is provided on the first electrode 13. Part of the planar shape of the second layer 13B is coated with the insulating film 14. Of the second layer 13B, a surface exposed portion 13D exposed from the insulating film 14 is an oxide electric conductor film 13B1. Meanwhile, of the second layer 13B, a surface coated portion 13E coated with the insulating film 14 is a metal film 13B2 made of a metal whose oxide exhibits electric conductivity such as indium (In), tin (Sn), zinc (Zn), and cadmium (Cd). Thereby, in the display unit, particles caused by a sputtering target are decreased in the after-mentioned manufacturing process, and favorable electric conductivity is obtainable between the first layer 13A and the second layer 13B.

It is preferable that the oxide electric conductor film 13B1 be specifically made of an oxide electric conductor containing at least one element selected from the group consisting of indium (In), tin (Sn), zinc (Zn), and cadmium (Cd). Examples thereof include at least one selected from the group consisting of a compound containing indium (In), tin (Sn), and oxide (O) (ITO (Indium Tin Oxide)), a compound containing indium (In), zinc (Zn), and oxide (O) (IZO (Indium Zinc Oxide)), indium oxide ($In_2O_3$), tin oxide ($SnO_2$), zinc oxide (ZnO), and cadmium oxide (CdO).

The thickness of the second layer 13B is preferably, for example, from 0.5 nm (5 Å) to 3 nm (30 Å) both inclusive. If the thickness is smaller than 0.5 nm, improvement effect of hole injection efficiency is not obtained. Meanwhile, if the thickness is larger than 3 nm, it becomes difficult to form the oxide electric conductor film 13B1 having sufficient transparency by surface oxidation treatment in the after-mentioned manufacturing process.

The third layer 13C is inserted for the purpose of preventing the first layer 13A from being separated from the planarizing layer 12, decreasing contact resistance with a source drain electrode layer 201, facilitating shape control in patterning the first electrode 13 or the like. The third layer 13C is, for example, from 5 nm to 200 nm both inclusive thick, and preferably from 10 nm to 50 nm both inclusive thick, and is composed of indium (In), tin (Sn), zinc (Zn), or cadmium (Cd). Further, the third layer 13C may be made of an oxide electric conductor containing at least one element selected from the group consisting of indium (In), tin (Sn), zinc (Zn), and cadmium (Cd). Specific examples thereof include at least one selected from the group consisting of ITO, IZO, indium oxide ($In_2O_3$), tin oxide ($SnO_2$), zinc oxide (ZnO), and cadmium oxide (CdO). The third layer 13C is not necessarily made of the same material as that of the second layer 13B, or not necessarily made of an oxide of the material of the second layer 13B. Further, the third layer 13C is not necessarily provided.

As will be described later, such a first electrode 13 is formed by forming the laminated structure sequentially including the third layer 13C, the first layer 13A, and the second layer 13B over the substrate 11, and then performing surface oxidation treatment and thereby modifying the surface exposed portion 13D of the second layer 13B into the oxide electric conductor film 13B1.

The insulating film 14 is intended to secure insulation properties between the first electrode 13 and the second electrode 16, and accurately obtain a desired shape of the light emitting region. It is preferable that the insulating film 14 be made of a material that does not have electric conductivity and has oxidation resistance. Thereby, it is possible to prevent ashing of the insulating film 14 by the surface oxidation treatment in the after-mentioned manufacturing process. Specific examples thereof include an organic material such as photosensitive acryl, polyimide, and polybenzoxazole; an inorganic insulating material such as a silicon oxide, a silicon nitride, and a silicon acid nitride; and a composite film thereof. The insulating film 14 is provided on the first electrode 13, and has an aperture 14A correspondingly to the light emitting region of the first electrode 13. A region in the aperture 14A corresponds to the surface exposed portion 13D of the second layer 13B, that is, the oxide electric conductor film 13B1. The organic layer 15 and the second electrode 16 may be provided not only in the light emitting region but also on the insulating film 14 continuously. However, light is emitted only in the aperture 14A of the insulating film 14.

The organic layer 15 has, for example, a structure in which a hole injection layer, a hole transport layer, the light emitting layer, and an electron transport layer (all elements are not illustrated) are sequentially layered from the first electrode 13 side. Of the foregoing layers, the layers other than the light emitting layer may be provided according to needs. Further, the organic layer 15 may have a structure different according to the light emitting color of the organic light emitting devices 10R, 10G and 10B. The hole injection layer is intended to improve the hole injection efficiency and functions as a buffer layer to prevent leakage. The hole transport layer is intended to improve efficiency to transport hole to the light emitting layer. The light emitting layer is intended to generate light due to electron-hole recombination by applying the electric field. The electron transport layer is intended to improve efficiency to transport electron to the light emitting layer. An electron injection layer (not illustrated) composed of LIF, $Li_2O$ or the like may be provided between the electron transport layer and the second electrode 16.

Examples of materials for the hole injection layer of the organic light emitting device 10R include 4,4',4"-tris(3-methylphenylphenylamino)triphenyl amine (m-MTDATA) or 4,4',4"-tris(2-naphthylphenylamino)triphenyl amine (2-TNATA). Examples of materials for the hole transport layer of the organic light emitting device 10R include bis[(N-naphthyl)-N-phenyl]benzidine (α-NPD). Examples of materials for the light emitting layer of the organic light emitting device 10R include a material in which 40 volume % of 2,6-bis [4-[N-(4-methoxyphenyl)-N-phenyl]aminostyryl] naphthalene-1,5-dicarbonitrile (BSN-BCN) is mixed with 8-quinolinol aluminum complex ($Alq_3$). Examples of materials for the electron transport layer of the organic light emitting device 10R include $Alq_3$.

Examples of materials for the hole injection layer of the organic light emitting device 10G include m-MTDATA and 2-TNATA. Examples of materials for the hole transport layer of the organic light emitting device 10G include, α-NPD. Examples of materials for the light emitting layer of the organic light emitting device 10G include a material in which 3 volume % of Coumarin 6 is mixed with $Alq_3$. Examples of materials for the electron transport layer of the organic light emitting device 10G include $Alq_3$.

Examples of materials for the hole injection layer of the organic light emitting device 10B include m-MTDATA and 2-TNATA. Examples of materials for the hole transport layer of the organic light emitting device 10B include α-NPD. Examples of materials for the light emitting layer of the organic light emitting device 10B include spiro 6Φ. Examples of materials for the electron transport layer of the organic light emitting device 10B include a material being from 5 nm to 300 nm both inclusive thick, for example, $Alq_3$.

The second electrode 16 is formed as an electrode common to the organic light emitting devices 10R, 10G and 10B. The second electrode 16 is, for example, from 5 nm to 50 nm both inclusive thick, and is made of a simple substance or an alloy of a metal element such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. Further, the second electrode 16 may be made of at least one selected from the group consisting of ITO, IZO, indium oxide ($In_2O_3$), tin oxide ($SnO_2$), zinc oxide (ZnO), and cadmium oxide (CdO).

The display unit may be manufactured, for example, as follows.

FIG. 5A to FIG. 8 illustrate a method of manufacturing the display unit in order of steps. First, as illustrated in FIG. 5A, the pixel drive circuit 140 including the drive transistor Tr1 is formed on the substrate 11 made of the foregoing material. Next, as illustrated in FIG. 5A as well, the planarizing layer 12 and the connection hole 12A are formed and fired by, for example, coating the whole area of the substrate 11 with a photosensitive resin and providing exposure and development.

Subsequently, as illustrated in FIG. 5A as well, the third layer 13C made of the foregoing material having the foregoing thickness is formed by, for example, sputtering method.

After that, as illustrated in FIG. 5B, the first layer 13A made of the foregoing material having the foregoing thickness is formed by, for example, sputtering method.

After the first layer 13A is formed, as illustrated in FIG. 5C, the second layer 13B made of a metal whose oxide exhibits electric conductivity such as indium (In), tin (Sn), zinc (Zn), and cadmium (Cd) having the foregoing thickness is formed by, for example, sputtering method. At this time, as a sputtering target, a metal target such as indium (In), tin (Sn), zinc (Zn), and cadmium (Cd) is able to be used. Thus, film forming with few particles is enabled by using a large integral target no separation needed. As a result, interlayer short circuit defect causing defect of light emission is prevented.

In forming the third layer 13C or the second layer 13B, it is possible to use reactive sputtering in which a metal target such as indium (In), tin (Sn), zinc (Zn), and cadmium (Cd) is used, and sputtering is made while oxidation is made by using oxygen in addition to inert sputtering gas such as argon (Ar). In this case, the third layer 13C or the second layer 13B is made of an oxide electric conductor including at least one element selected from the group consisting of indium (In), tin (Sn), zinc (Zn), and cadmium (Cd). Specific examples thereof include at least one selected from the group consisting of ITO, IZO, indium oxide ($In_2O_3$), tin oxide ($SnO_2$), zinc oxide (ZnO), and cadmium oxide (CdO). In reactive sputtering, though there is a concern that the particles are increased in some small measure, influence of the particles is suppressed by using the metal target compared to a case that a separated oxide electric conductor target is used.

After the second layer 13B is formed, as illustrated in FIG. 6A, a mask 41 made of a photoresist is formed on the second layer 13B, and exposure and development are provided by using, for example, lithography technique to provide patterning in a predetermined shape. Subsequently, as illustrated in FIG. 6B, the second layer 13B, the first layer 13A, and the third layer 13C are etched by using the mask 41. After that, as illustrated in FIG. 7A, the mask 41 is removed.

After that, the whole area of the substrate 11 is coated with a photosensitive resin, exposure and development treatment is provided, and the resultant is fired. Thereby, as illustrated in FIG. 7B, the insulating film 14 having the aperture 14A is formed on the laminated structure including the third layer 13C, the first layer 13A, and the second layer 13B. A region in the aperture 14A is the surface exposed portion 13D where the second layer 13B is exposed from the insulating film 14.

Figure 8:
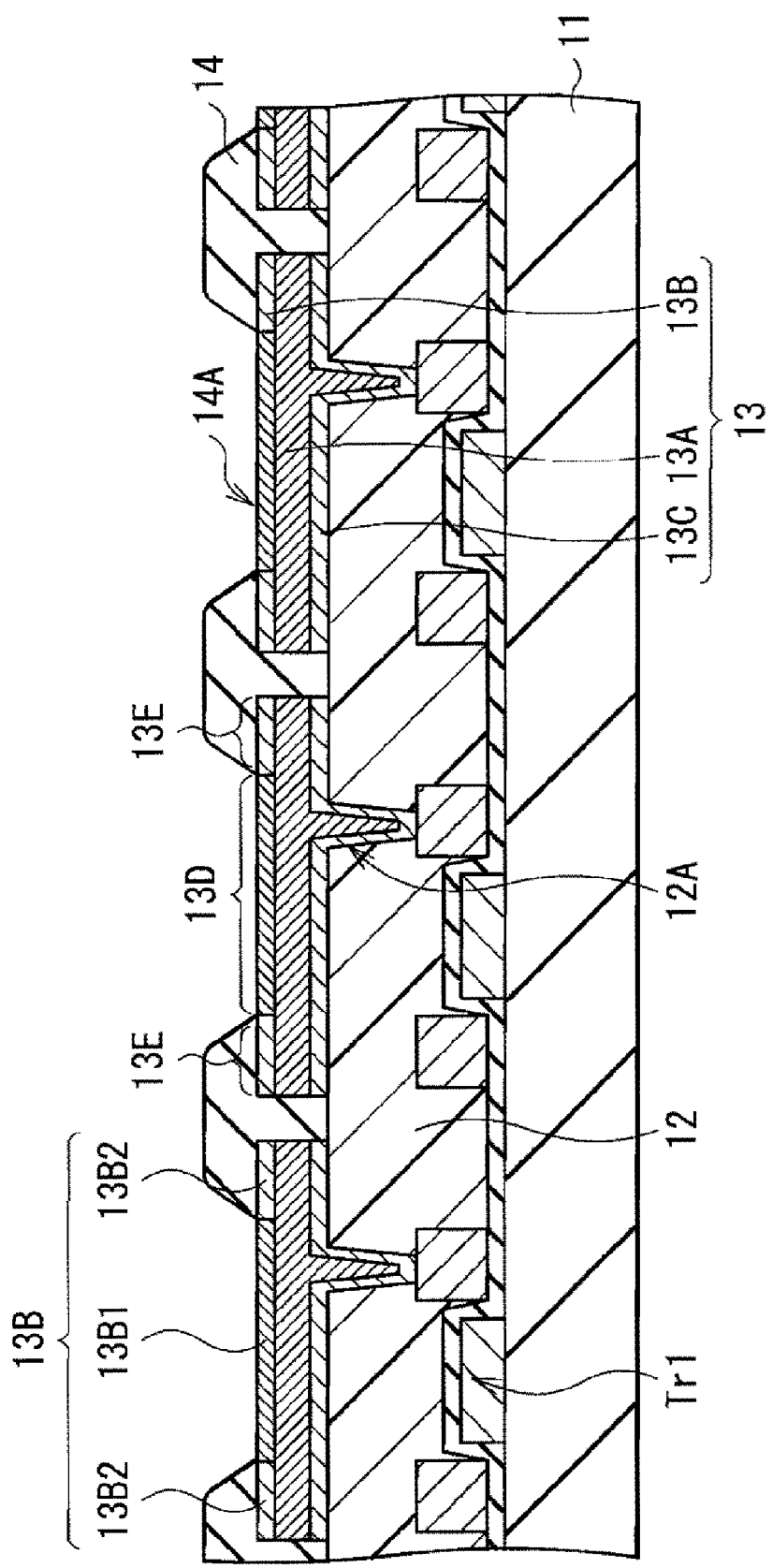
FIG. 8 is a cross sectional view illustrating a step following FIGS. 7A and 7B.

After the insulating film 14 is formed, surface oxidation treatment is provided for the surface exposed portion 13D. Thereby, as illustrated in FIG. 8, the oxide electric conductor film 13B1 made of the foregoing material is formed in the surface exposed portion 13D. Meanwhile, of the second layer 13B, the surface coated portion 13E coated with the insulating film 14 is a region not provided with the surface oxidation treatment, and the metal film 13B2 made of the foregoing material remains. As the surface oxidation treatment, for example, high consistency ozone water/oxygen (or N2O) plasma treatment, hot annealing under oxygen atmosphere, or a mixed process thereof is able to be used. The step may be performed together with the precedent firing step, or may be performed in any step after forming the second layer 13B.

In practice, oxidation control to oxidize only the second layer 13B is difficult. If oxidation is weak, in the surface exposed portion 13D of the second layer 13B, only part in the thickness direction becomes the oxide electric conductor film 13B1, a metal film not oxidized remains in the rest of the surface exposed portion 13D in the thickness direction, and the reflectance of the first electrode 13 may be thereby lowered. However, even if a metal film being about 1 nm thick remains, light is able to pass through the metal film, and influence to light usage efficiency may be little. Therefore, it is enough that the oxide electric conductor film 13B1 is formed in at least part in the thickness direction of the second layer 13B.

Figure 9:
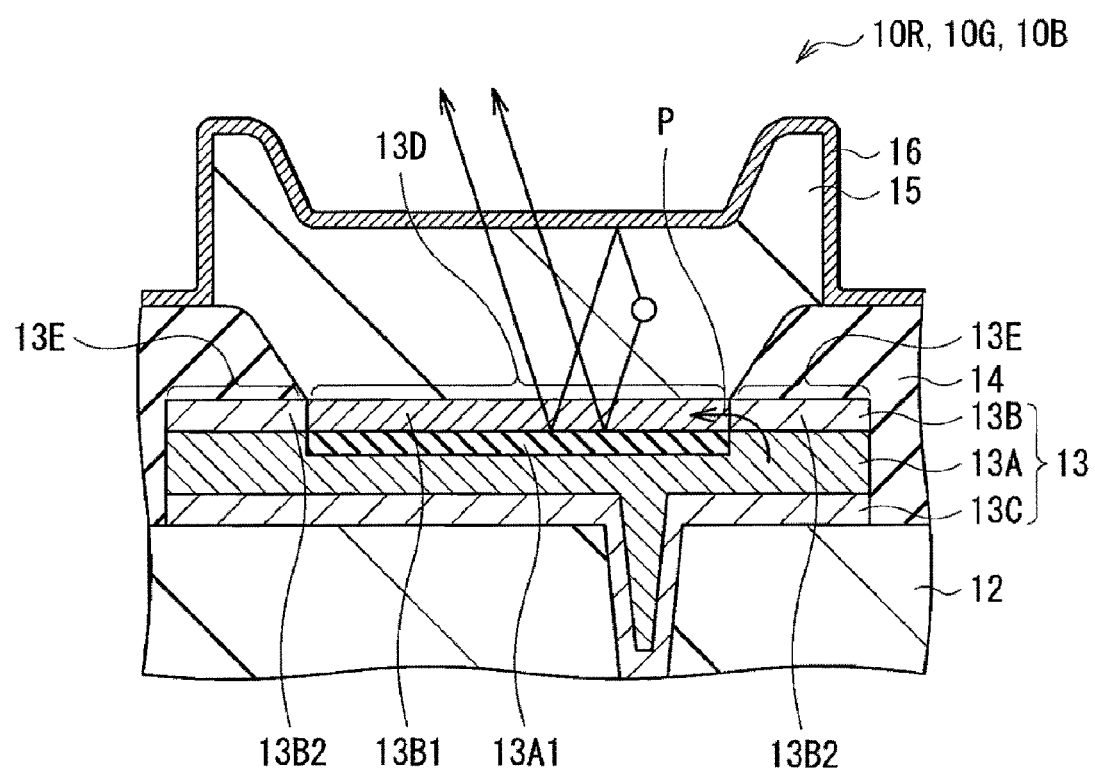
FIG. 9 is a view for explaining operation of the first electrode illustrated in FIG. 3.

Meanwhile, under conditions of strong oxidation, as illustrated in FIG. 9, in some cases, an oxide film 13A1 made of a favorable insulator is formed in the surface layer of the first layer 13A, that is, in the interface with the second layer 13B. However, in the surface coated portion 13E coated with the insulating film 14 in the second layer 13B, the metal film 13B2 remains. Thus, the first layer 13A is connected to the oxide electric conductor film 13B1 of the second layer 13B through the metal film 13B2 with low contact resistance, and favorable electric conduction characteristics are able to be realized.

After that, the organic layer 15 and the second electrode 16 made of the foregoing material are formed by, for example, evaporation method. Accordingly, the organic light emitting devices 10R, 10G and 10B are formed. Subsequently, the organic light emitting devices 10R, 10G and 10B are coated with the protective film 17 made of the foregoing material. On the protective film 17, the adhesive layer 20 is formed. Subsequently, the sealing substrate 31 that is provided with the color filter 32 and is made of the foregoing material is prepared. The substrate 11 provided with the organic light emitting devices 10R, 10G and 10B and the sealing substrate 31 are bonded with the adhesive layer 20 in between. Accordingly, the display unit illustrated in FIG. 1 to FIG. 4 is completed.

In the display unit, a scanning signal is supplied from the scanning line drive circuit 130 to each pixel through the gate electrode of the writing transistor Tr2. An image signal from the signal line drive circuit 120 is retained in the retentive capacity Cs through the writing transistor Tr2. That is, the drive transistor Tr1 is on/off-controlled according to the signal retained in the retentive capacity Cs. Thereby, drive current Id is injected into the respective organic light emitting devices 10R, 10G and 10B. As a result, electron-hole recombination occurs, and thereby light is emitted. The light is extracted through the second electrode 16, the color filter 32, and the sealing substrate 31. In this embodiment, the first electrode 13 is formed by forming the laminated structure sequentially including the first layer 13A made of a metal and the second layer 13B made of a metal whose oxide exhibits electric conductivity over the substrate 11, and then performing surface oxidation treatment and thereby forming the oxide electric conductor film 13B1 in at least part in the thickness direction of the second layer 13B. Thus, particles caused by a sputtering target in forming the second layer 13B are decreased. Therefore, dark dot defect due to interlayer short circuit defect is prevented, and display quality is improved.

Further, in the second layer 13B, the surface exposed portion 13D exposed from the insulating film 14 is the oxide electric conductor film 13B1, and the surface coated portion 13E coated with the insulating film 14 is the metal film 13B2 made of a metal whose oxide exhibits electric conductivity. Thus, even if the oxide film 13A1 is formed in the surface layer of the first layer 13A, the first layer 13A is connected to the oxide electric conductor film 13B1 by a path P through the metal film 13B2 with low contact resistance, and favorable electric conduction characteristics are obtainable between the first layer 13A and the second layer 13B.

As described above, in this embodiment, in the step of forming the first electrode 13, the laminated structure sequentially including the first layer 13A made of the metal and the second layer 13B made of the metal whose oxide exhibits electric conductivity is formed over the substrate 11, and then surface oxidation treatment is performed and thereby the oxide electric conductor film 13B1 is formed in at least part in the thickness direction of the second layer 13B. Thus, the particles caused by the sputtering target in film-forming the second layer 13B are able to be decreased. Therefore, dark dot defect due to interlayer short circuit defect is able to be prevented.

Further, in the second layer 13B, at least part in the thickness direction of the surface exposed portion 13D exposed from the insulating film 14 is the oxide electric conductor film 13B1, and the surface coated portion 13E coated with the insulating film 14 is the metal film 13B2 made of the metal whose oxide exhibits electric conductivity. Thus, even if the oxide film 13A1 is formed in the surface layer of the first layer 13A, the first layer 13A is connected to the oxide electric conductor film 13B1 by the path P through the metal film 13B2 with low contact resistance, and favorable electric conduction characteristics are obtainable between the first layer 13A and the second layer 13B.

Figure 10:
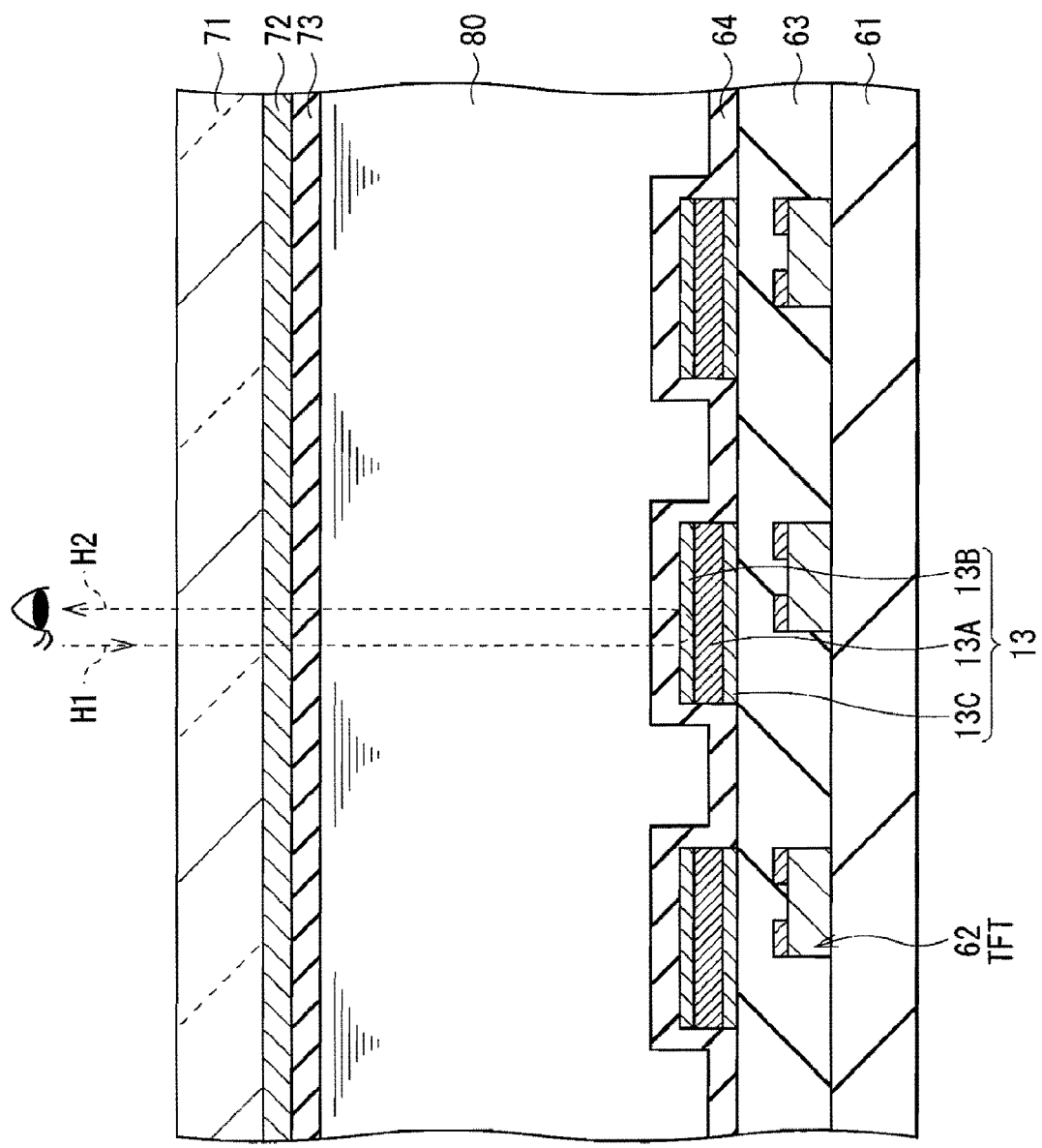
FIG. 10 is a view illustrating a modification of the invention.

Further, in the foregoing embodiment, the description has been given of a case that the invention is applied to the organic EL display unit. However, the invention is applicable to a reflective liquid crystal display unit, for example, as illustrated in FIG. 10. In the reflective liquid crystal display unit, for example, a TFT 62, a planarizing layer 63, the foregoing first electrode 13 as a pixel electrode, and an alignment film 64 are formed over a substrate 61 made of glass; a common electrode 72 and an alignment film 73 are formed on a substrate 71 made of glass, and a liquid crystal layer 80 is provided therebetween. In the case of the liquid crystal display unit, for example, the second layer 13B also has a function as a protective layer to prevent the liquid crystal from being contaminated by aluminum or the like contained in the first layer 13A.

In the case of the liquid crystal display unit, surface oxidation treatment is performed for the entire planar shape of the second layer 13B, and thereby the oxide electric conductor film 13B1 is formed. That is, it is not necessary to form the surface exposed portion 13D in part of the planar shape of the second layer 13B and perform surface oxidation treatment only for the surface exposed portion 13D as in the foregoing embodiment.

Further, in the case of the liquid crystal display unit, the oxide film 13A1 may be formed on the surface of the first layer 13A. In the case of the liquid crystal display unit, the pixel electrode (first electrode 13) is used for the purpose of controlling electric field of the liquid crystal layer 80, and thus effect of hole injection from the surface of the pixel electrode is not necessitated.

Module and Application Examples

A description will be given of application examples of the display unit described in the foregoing embodiment. The display unit of the foregoing embodiment is applicable to a display unit of an electronic device in any field for displaying a picture signal inputted from outside or a picture signal generated inside as an image or a picture, such as a television device, a digital camera, a notebook personal computer, a portable terminal device such as a mobile phone, and a video camera.

Module

Figure 11:
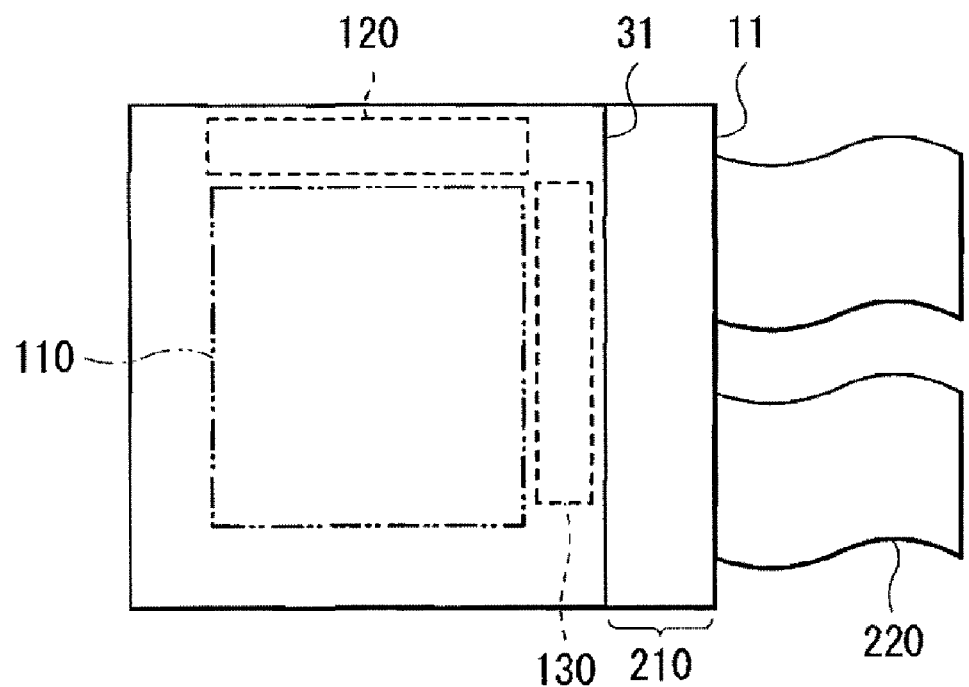
FIG. 11 is a plan view illustrating a schematic configuration of a module including the display unit of the foregoing embodiment.

The display unit of the foregoing embodiment is incorporated in various electronic devices such as after-mentioned first to fifth application examples as a module as illustrated in FIG. 11, for example. In the module, for example, a region 210 exposed from the sealing substrate 31 and the adhesive layer 20 is provided on a side of the substrate 11, and an external connection terminal (not illustrated) is formed in the exposed region 210 by extending the wirings of the signal line drive circuit 120 and the scanning line drive circuit 130. The external connection terminal may be provided with a Flexible Printed Circuit (FPC) 220 for inputting and outputting a signal.

First Application Example

Figure 12:
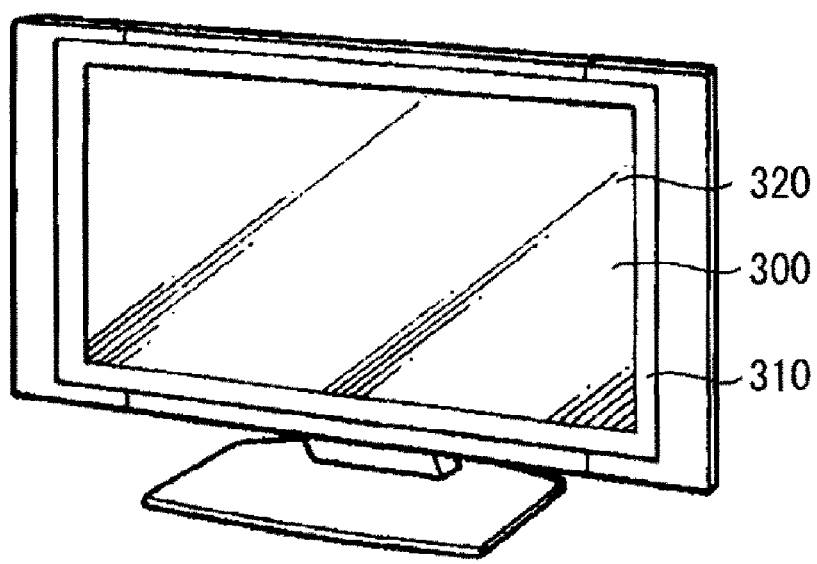
FIG. 12 is a perspective view illustrating an appearance of a first application example of the display unit of the foregoing embodiment.

FIG. 12 is an appearance of a television device to which the display unit of the foregoing embodiment is applied. The television device has, for example, a picture display screen section 300 including a front panel 310 and a filter glass 320. The picture display screen section 300 is composed of the display unit according to the foregoing embodiment.

Second Application Example

Figure 13A:
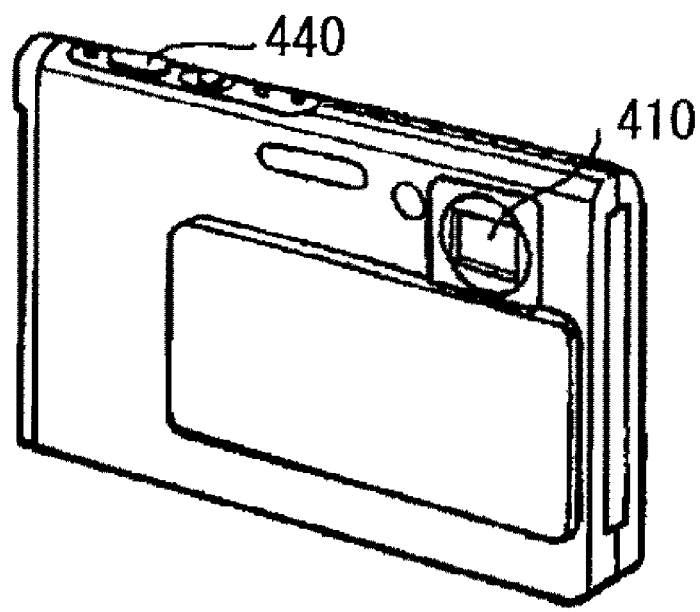
FIG. 13A is a perspective view illustrating an appearance viewed from the front side of a second application example.
Figure 13B:
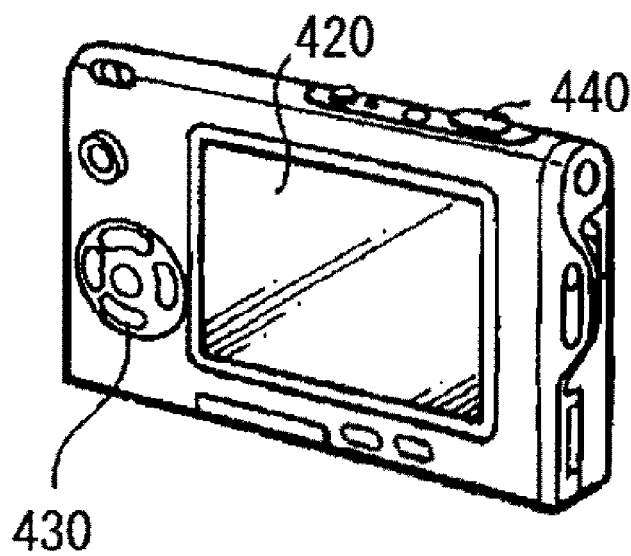
FIG. 13B is a perspective view illustrating an appearance viewed from the rear side of the second application example.

FIGS. 13A and 13B are an appearance of a digital camera to which the display unit of the foregoing embodiment is applied. The digital camera has, for example, a light emitting section for a flash 410, a display section 420, a menu switch 430, and a shutter button 440. The display section 420 is composed of the display unit according to the foregoing embodiment.

Third Application Example

Figure 14:
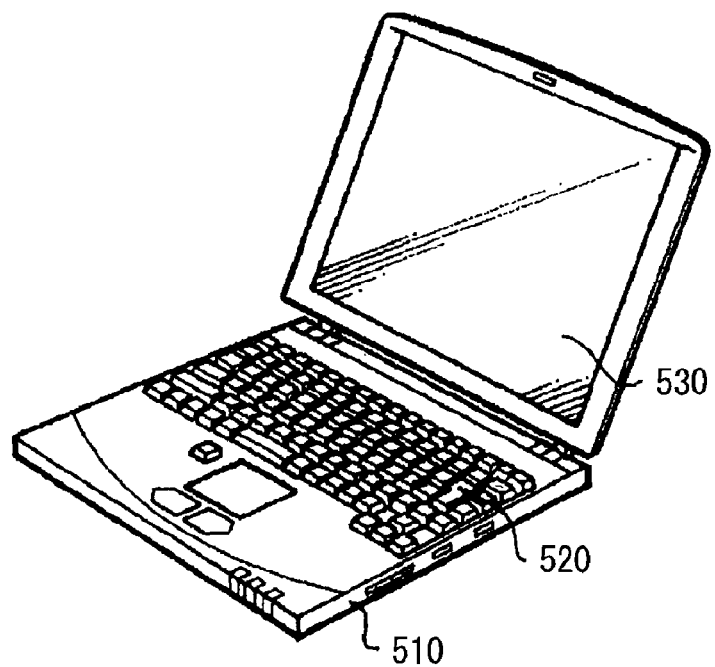
FIG. 14 is a perspective view illustrating an appearance of a third application example.

FIG. 14 is an appearance of a notebook personal computer to which the display unit of the foregoing embodiment is applied. The notebook personal computer has, for example, a main body 510, a keyboard 520 for operation of inputting characters and the like, and a display section 530 for displaying an image. The display section 530 is composed of the display unit according to the foregoing embodiment.

Fourth Application Example

Figure 15:
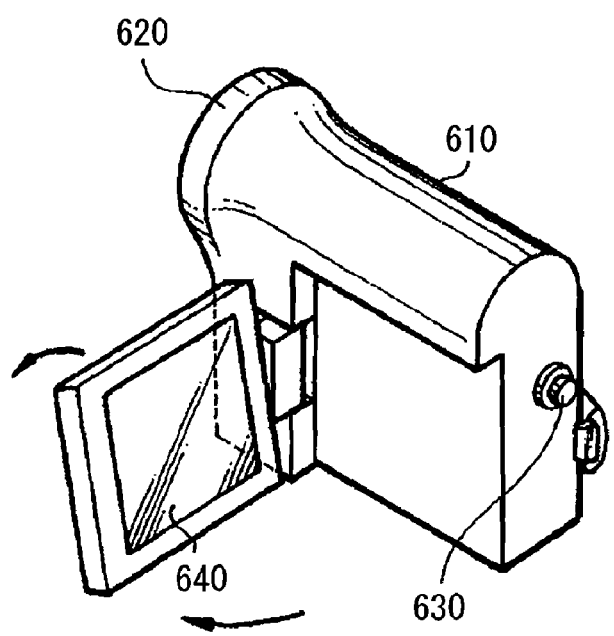
FIG. 15 is a perspective view illustrating an appearance of a fourth application example.

FIG. 15 is an appearance of a video camera to which the display unit of the foregoing embodiment is applied. The video camera has, for example, a main body 610, a lens for shooting an object 620 provided on the front side face of the main body 610, a start/stop switch in shooting 630, and a display section 640. The display section 640 is composed of the display unit according to the foregoing embodiment.

Fifth Application Example

FIGS. 16A to 16G are an appearance of a mobile phone to which the display unit of the foregoing embodiment is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing embodiment.

While the invention has been described with reference to the embodiment, the invention is not limited to the foregoing embodiment, and various modifications may be made. For example, the material, the thickness, the film-forming method, the film-forming conditions and the like of each layer are not limited to those described in the foregoing embodiment, but other material, other thickness, other film-forming method, and other film-forming conditions may be adopted. For example, part of the planar shape of the second layer 13B is coated with the insulating film 14 to perform surface oxidation treatment in the foregoing embodiment. However, part of the planar shape of the second layer 13B maybe covered with a mask instead of the insulating film 14.

In addition, in the foregoing embodiment, the description has been specifically given of the structure of the organic light emitting devices 10R, 10G and 10B. However, it is not necessary to provide all layers, and other layer may be further provided. For example, in the foregoing embodiment, the description has been given of a case that the first electrode 13 is formed in the layer located above the pixel drive circuit 140 with the planarizing layer 12 in between. However, the first electrode 13 may be formed in the same layer as that of the pixel drive circuit 140. Otherwise, the source/drain electrode of the TFT and the first electrode 13 may be configured as a common electrode.

In addition, in the foregoing embodiment, the description has been given of the active matrix display unit. However, the invention is also applicable to a passive matrix display unit. In addition, in the foregoing embodiment, the description has been given of the electrode formation method of the top emission type electrode in which light generated in the light emitting layer is extracted from the second electrode 16 side. However, the invention is also applicable to the electrode formation of bottom emission type in which light generated in the light emitting layer is extracted from the first electrode 13 side. Furthermore, the configuration of the pixel drive circuit for driving the active matrix is not limited to the configuration described in the foregoing embodiment. If necessary, a capacity device or a transistor may be added. In this case, according to the change of the pixel drive circuit, a necessary drive circuit may be added in addition to the foregoing signal line drive circuit 120 and the scanning line drive circuit 130.

Further, the invention is applicable not only to the organic EL display unit or the liquid crystal display unit described in the foregoing embodiment, but also to other display unit such as an inorganic EL display unit.

The present application contains subject matter related to that disclosed in Japanese Priority Patent Application JP 2008-150567 filed in the Japanese Patent Office on Jun. 9, 2008, the entire content of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A method of manufacturing a display unit having a display layer between a first electrode and a second electrode, wherein a step of forming the first electrode comprises the steps of:
   forming a laminated structure sequentially including a first layer made of a metal and a second layer made of a metal whose oxide exhibits electric conductivity over a substrate; and
   providing surface oxidation treatment after forming the laminated structure and thereby forming an oxide electric conductor film in at least part in a thickness direction of the second layer.

2. The method of manufacturing a display unit according to claim 1, wherein a region not provided with the surface oxidation treatment is formed in part in a planar shape of the second layer.

3. The method of manufacturing a display unit according to claim 2, wherein after the laminated structure is formed, an insulating film covering the part in the planar shape of the second layer is formed on the laminated structure, the surface oxidation treatment is provided for a surface exposed portion exposed from the insulating film of the second layer, and the surface oxidation treatment is not provided for a surface coated portion coated with the insulating film of the second layer.

4. The method of manufacturing a display unit according to claim 3, wherein the insulating film is made of a material having oxidation resistance.

5. The method of manufacturing a display unit according to claim 1, wherein as the metal whose oxide exhibits electric conductivity, at least one selected from the group consisting of indium (In), tin (Sn), zinc (Zn), and cadmium (Cd) is used.

6. The method of manufacturing a display unit according to claim 1, wherein the first layer is made of a high reflectance electric conductor.

7. The method of manufacturing a display unit according to claim 6, wherein the first layer is made of aluminum or an alloy containing aluminum, or silver or an alloy containing silver.

8. A display unit having a display layer between a first electrode and a second electrode, wherein
   the first electrode is formed by forming a laminated structure sequentially including a first layer made of a metal and a second layer made of a metal whose oxide exhibits electric conductivity over a substrate, and then providing surface oxidation treatment and thereby forming an oxide electric conductor film in at least part in a thickness direction of the second layer.

9. A display unit having a display layer between a first electrode and a second electrode, wherein
   the first electrode has a laminated structure composed of a first layer made of a metal and a second layer,
   an insulating film covering part in a planar shape of the second layer is provided on the first electrode,
   at least part in a thickness direction of a surface exposed portion exposed from the insulating film of the second layer is an oxide electric conductor film, and
   a surface coated portion covered with the insulating film of the second layer is a metal film made of a metal whose oxide exhibits electric conductivity.

* * * * *